US008927415B2

(12) United States Patent
Niyogi et al.

(10) Patent No.: US 8,927,415 B2
(45) Date of Patent: Jan. 6, 2015

(54) GRAPHENE BARRIER LAYERS FOR INTERCONNECTS AND METHODS FOR FORMING THE SAME

(71) Applicant: Intermolecular, Inc., San Jose, CA (US)

(72) Inventors: Sandip Niyogi, San Jose, CA (US); Chi-I Lang, Cupertino, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/134,219

(22) Filed: Dec. 19, 2013

(65) Prior Publication Data

US 2014/0106561 A1  Apr. 17, 2014

Related U.S. Application Data

(63) Continuation-in-part of application No. 13/726,834, filed on Dec. 26, 2012, now Pat. No. 8,647,894, which is a continuation of application No. 13/315,524, filed on Dec. 9, 2011, now Pat. No. 8,361,813.

(51) Int. Cl.
*H01L 21/00* (2006.01)
*H01L 21/768* (2006.01)
*C23C 14/04* (2006.01)
*C23C 14/06* (2006.01)
*C23C 14/18* (2006.01)
*C23C 14/58* (2006.01)
*H01L 21/3205* (2006.01)
*H01L 23/532* (2006.01)
*H01L 21/02* (2006.01)

(52) U.S. Cl.
CPC ........ *H01L 21/76846* (2013.01); *C23C 14/042* (2013.01); *C23C 14/0605* (2013.01); *C23C 14/185* (2013.01); *C23C 14/5806* (2013.01); *H01L 21/32051* (2013.01); *H01L 23/53238* (2013.01); *H01L 21/76855* (2013.01); *H01L 21/76867* (2013.01); *H01L 21/76871* (2013.01); *H01L 21/02422* (2013.01); *H01L 21/02527* (2013.01); *H01L 21/02672* (2013.01); *H01L 23/53276* (2013.01); *H01L 21/76823* (2013.01); *H01L 21/0243* (2013.01); *H01L 2924/0002* (2013.01)
USPC ............................................. 438/627; 438/99

(58) Field of Classification Search
None
See application file for complete search history.

(56) References Cited

U.S. PATENT DOCUMENTS

| 7,982,296 | B2 | 7/2011 | Nuzzo et al. | |
|---|---|---|---|---|
| 2010/0247801 | A1* | 9/2010 | Zenasni | 427/554 |
| 2011/0006425 | A1* | 1/2011 | Wada et al. | 257/750 |
| 2011/0030772 | A1* | 2/2011 | Veerasamy | 136/256 |
| 2011/0278529 | A1* | 11/2011 | Xu | 257/2 |
| 2012/0141799 | A1 | 6/2012 | Kub et al. | |

OTHER PUBLICATIONS

Transforming amorphous carbon into graphene by currentinduced annealing by Amelia Barreiro et al.*

(Continued)

*Primary Examiner* — Charles Garber
*Assistant Examiner* — Evren Seven

(57) ABSTRACT

Embodiments described herein provide interconnect barrier layers and methods for forming such barriers. A dielectric body having a trench formed in a surface thereof is provided. A first layer is formed above the dielectric body within the trench. The first layer includes amorphous carbon. A second layer is formed above the first layer. The second layer includes a metal. The dielectric body, the first layer, and the second layer are heated to convert at least some of the amorphous carbon to graphene.

19 Claims, 13 Drawing Sheets

(56) References Cited

OTHER PUBLICATIONS

Multi-layer Graphene Wire Grown by Annealing Sputtered Amorphous Carbon by Motonobu Sato et al.*

Metal-catalyzed crystallization of amorphous carbon to graphene by Maxwell Zheng et al.*

Mixed phase, sp2-sp3 bonded, and disordered few layer graphene-like nanocarbon: Synthesis and characterizations by Arvind Kumara et al.*

Chen et al.; Graphene Interconnect Lifetime: A Reliability Analysis; Nov. 2012; IEEE Electron Device Letters, vol. 33, No. 11; IEEE; pp. 1604-1606.

Choi et al.; Drastic reduction in the growth temperature of graphene on copper via enhanced London dispersion force; May 31, 2013; Scientific Reports; pp. 1-6.

Kang et al.; Effects of multi-layer graphene capping on Cu interconnects; Mar. 1, 2013; IOP Publishing Ltd.; Nanotechnology; pp. 1-5.

Kim et al.; Graphene as a diffusion barrier for Al and Ni/Au contacts on silicon; Apr. 23, 2012; Journal of Vacuum Science and Technology; American Vacuum Society; pp. 030602-1-030602-4.

Li et al.; Evolution of Graphene Growth on Ni and Cu by Carbon Isotope Labeling; Aug. 27, 2009; Nano Letters, vol. 9, No. 12; American Chemical Society; pp. 4268-4272.

Rasool et al.; Continuity of Graphene on Polycrystalline Copper; Nov. 30, 2010; NanoLetters; American Chemical Society; pp. 251-256.

Schriver et al.; Graphene as a Long-Term Metal Oxidation Barrier: Worse Than Nothing; Jun. 7, 2013; ACSNano, vol. 7, No. 7; American Chemical Society; pp. 5763-5768.

Chen et al.; Oxidation Resistance of Graphene-Coated Cu and Cu/Ni Alloy; Jan. 28, 2011; ACSNano, vol. 5, No. 2; American Chemical Society; pp. 1321-1327.

* cited by examiner

US 8,927,415 B2

GRAPHENE BARRIER LAYERS FOR INTERCONNECTS AND METHODS FOR FORMING THE SAME

CROSS-REFERENCE TO RELATED APPLICATION

This application is a Continuation-In-Part of U.S. patent application Ser. No. 13/726,834, filed Dec. 26, 2012, which is a Continuation application of U.S. patent application Ser. No. 13/315,524, filed Dec. 9, 2011, and now issued as U.S. Pat. No. 8,361,813, each of which is incorporated by reference herein in their entirety for all purposes.

TECHNICAL FIELD

The present invention relates to barriers for interconnects, such as those formed in trenches in interlayer dielectrics (ILDs). More particularly, this invention relates to graphene barriers for interconnects and methods for forming such barriers.

BACKGROUND OF THE INVENTION

As the feature sizes of microelectronic assemblies (e.g., integrated circuits) continue to get smaller, manufacturing challenges become more apparent. For example, as the vias or interconnects, often made of copper, formed through interlayer dielectrics (ILDs) shrink in size with less distance separating adjacent vias, it becomes more difficult to form barrier layers within the via trenches which adequately prevent the copper (or other conductive material) from diffusing into the dielectric material, and possibly affecting circuit performance.

In recent years, tantalum nitride has been used with some success. However, as the thickness of the tantalum nitride is reduced to levels suitable for next generation devices (e.g., 1 nm), it often allows for an undesirable amount of copper diffusion, particular under relatively high temperatures (e.g., 350° C. and higher). Additionally, at such thicknesses, the degree of nucleation homogeneity, as well as compositional uniformity and control, becomes very demanding, requiring advanced atomic layer deposition (ALD) techniques and precursor chemistry.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
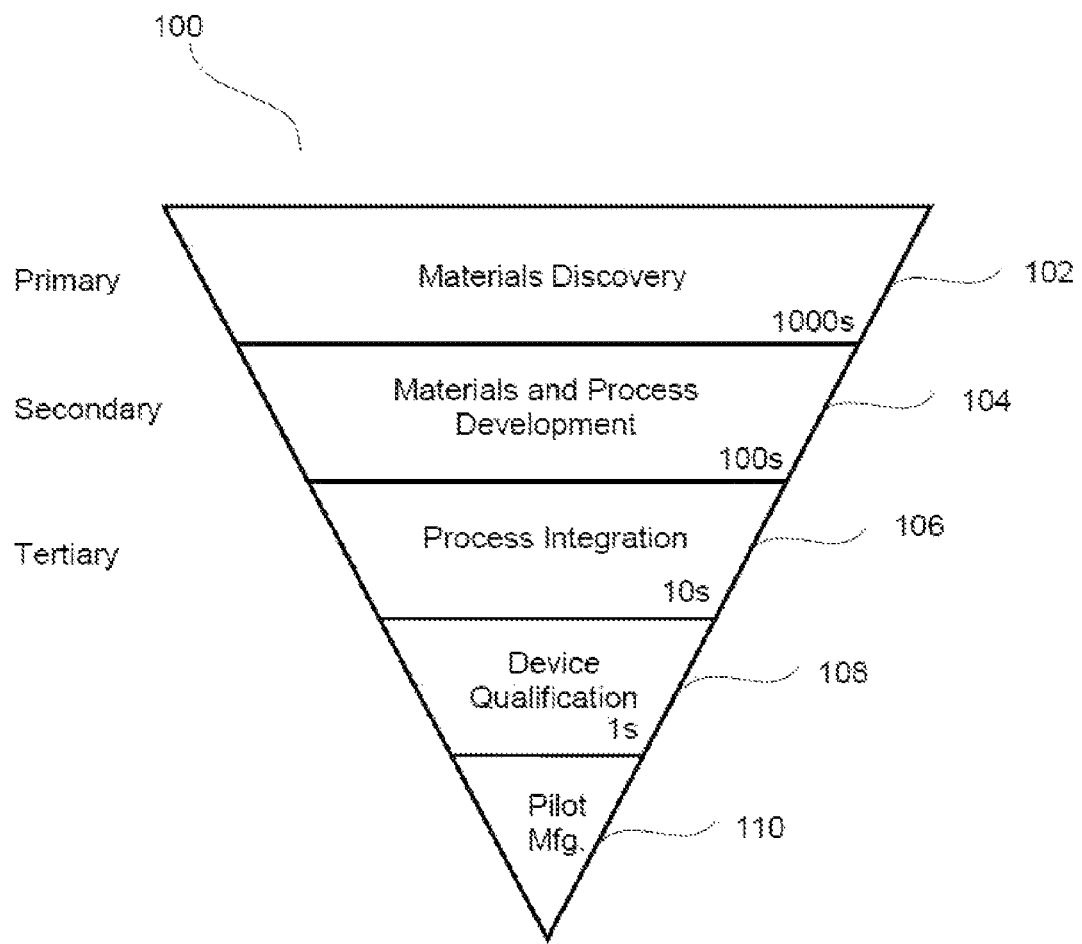
FIG. 1 illustrates a schematic diagram for implementing combinatorial processing and evaluation using primary, secondary, and tertiary screening.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

Embodiments described herein provide methods for forming barriers in trenches formed on/in dielectric layers, such as interlayer dielectrics (ILDs). In particular, methods are described for forming graphene barriers in via (or interconnect) trenches using processing temperatures suitable for conventional semiconductor processing. The methods described herein are particularly useful for future generation devices in which the feature sizes will continue to shrink (e.g., smaller/narrower trenches).

In some embodiments, a substrate having a dielectric layer formed above is provided. The dielectric layer has a trench formed in a surface thereof. A layer including amorphous carbon is formed (or deposited) in the trench. A seed layer (e.g., metal) is formed above the amorphous carbon. The substrate is heated to, for example, between about 120° C. to about 900° C. The heating process converts at least some of the amorphous carbon to graphene, which may be present in a layer(s) below and/or above the metal layer after the heating process.

The seed layer may be made of, for example, copper, nickel, cobalt, titanium, gold, and/or combinations thereof (e.g., alloys). The substrate may have a microelctronic device (e.g., a transistor) formed thereon. A conductive body (e.g., a via or interconnect) may be formed in the trench and be electrically connected/coupled to the microelectronic device. Combinatorial processing methods may be applied to the method to optimize the formation of the barrier(s).

As such, in accordance with some embodiments, combinatorial processing may be used to produce and evaluate different materials, substrates, chemicals, processes, coating stacks, and techniques related to carbon-containing materials, barrier layers, nucleation layers, and adhesion layers, as well as build structures or determine how carbon-containing materials coat, fill or interact with existing structures in order to vary materials, unit processes and/or process sequences across multiple site-isolated regions on the substrate(s). These variations may relate to specifications such as temperatures, exposure times, layer thicknesses, chemical compositions of majority and minority elements of layers, gas compositions, chemical compositions of wet and dry surface chemistries, power and pressure of sputter deposition conditions, humidity, etc. of the formulations and/or the substrates at various stages of the screening processes described herein. However, it should be noted that in some embodiments, the chemical composition (e.g., of the carbon-containing material and/or of the other components) remains the same, while other parameters are varied, and in other embodiments, the chemical composition is varied.

The manufacture of various devices, such as semiconductor devices, entails the integration and sequencing of many unit processing steps. For example, device manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power consumption, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition (e.g., the thickness ratio of the carbon layer and seed layer described below), iii) more than one sequence of processing conditions, iv) more than one process sequence integration flow, and combinations thereof, collectively known as "combinatorial process sequence integration," on a single monolithic substrate (e.g., an integrated or short-looped wafer) without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574, filed on Feb. 10, 2006, U.S. Pat. No. 7,824,935, filed on Jul. 2, 2008, U.S. Pat. No. 7,871,928, filed on May 4, 2009, U.S. Pat. No. 7,902,063, filed on Feb. 10, 2006, and U.S. Pat. No. 7,947,531, filed on Aug. 28, 2009, which are all herein incorporated by reference. Systems and methods for HPC processing are further described in U.S. patent application Ser. No. 11/352,077, filed on Feb. 10, 2006, claiming priority from Oct. 15, 2005, U.S. patent application Ser. No. 11/419,174, filed on May 18, 2006, claiming priority from Oct. 15, 2005, U.S. patent application Ser. No. 11/674,132, filed on Feb. 12, 2007, claiming priority from Oct. 15, 2005, and U.S. patent application Ser. No. 11/674,137, filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

FIG. 1 illustrates a schematic diagram 100 for implementing combinatorial processing and evaluation using primary, secondary, and tertiary screening. The schematic diagram 100 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

Although not shown, an initial stage may be implemented which includes a fast screening/search of structure-material property relationships, known process-material relationships, known stack-product (device) relationships, etc. within any available literature prior to starting any experimentation that results in materials discovery. After this initial stage, for example, thousands of materials are evaluated during a materials discovery stage, 102. Materials discovery stage 102 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage 104. Evaluation of the materials is performed using metrology tools such as ellipsometers, XRF, stylus profilers, hall measurements, optical transmission, reflection, and absorption testers, electronic testers and imaging tools (i.e., microscopes).

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106, where tens of materials and/or processes and combinations are evaluated. The tertiary screen or process integration stage 106 may focus on integrating the selected processes and materials with other processes and materials.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

The schematic diagram 100 is an example of various techniques that may be used to evaluate and select materials and processes for the development of new materials and processes. The descriptions of primary, secondary, etc. screening and the various stages 102-110 are arbitrary and the stages may overlap, occur out of sequence, be described and be performed in many other ways.

This application benefits from High Productivity Combinatorial (HPC) techniques described in U.S. patent application Ser. No. 11/674,137m filed on Feb. 12, 2007, which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of, for example, device manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate(s) that are equivalent to the structures formed during actual production of the device. For example, such structures may include, but would not be limited to, contact layers, buffer layers, absorber layers, or any other series of layers or unit processes that create an intermediate structure found on devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate(s) during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate, or substrates, that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate(s) can be defined as needed, but are preferably systematized for ease of tooling and design of experimentation. In addition, the number, variants and location of structures within each region are designed to enable valid statistical analysis of the test results within each region and across regions to be performed.

Figure 2:
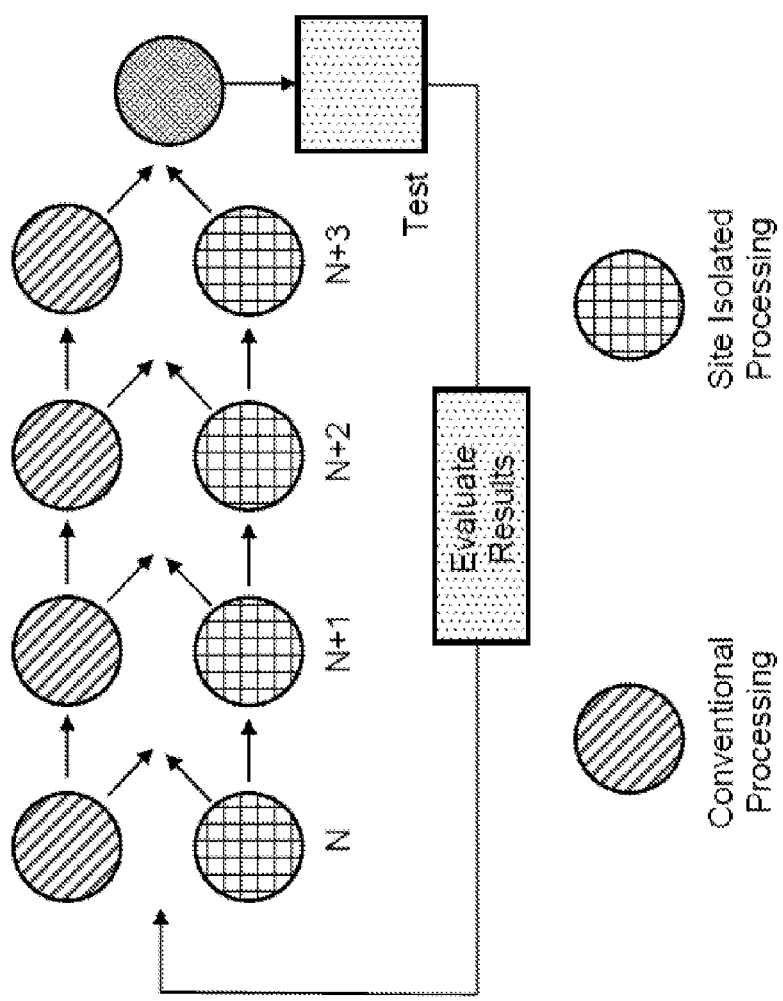
FIG. 2 is a simplified schematic diagram illustrating a general methodology for combinatorial process sequence integration that includes site isolated processing and/or conventional processing according to some embodiments.

FIG. 2 is a simplified schematic diagram illustrating a general methodology for combinatorial process sequence integration that includes site isolated processing and/or conventional processing in accordance with one embodiment of the invention. In one embodiment, the substrate(s) is initially processed using conventional process N. In one exemplary embodiment, the substrate is then processed using site isolated process N+1. During site isolated processing, an HPC module may be used, such as the HPC module described in U.S. patent application Ser. No. 11/352,077, filed on Feb. 10, 2006. The substrate(s) can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate, or from substrate to substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in device manufacturing may be varied.

Figure 3:
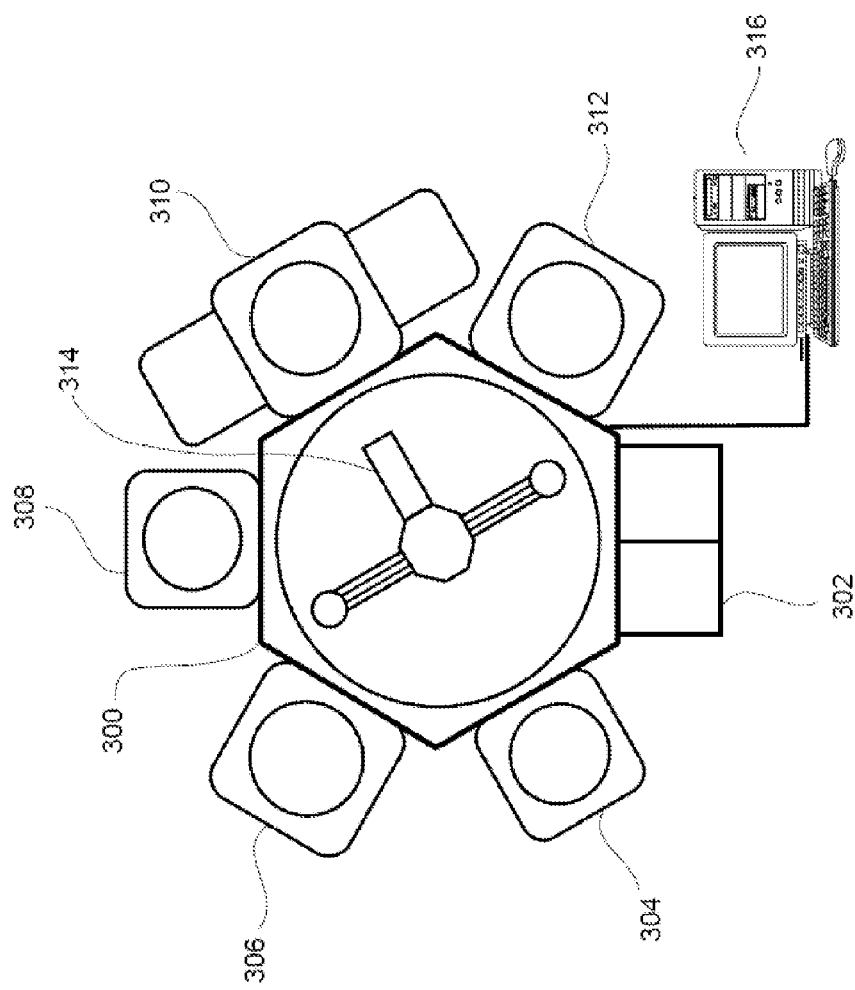
FIG. 3 is a simplified schematic diagram illustrating an integrated high productivity combinatorial (HPC) system according to some embodiments.

FIG. 3 is a simplified schematic diagram illustrating an integrated high productivity combinatorial (HPC) system according to some embodiments. HPC system includes a frame 300 supporting a plurality of processing modules. It should be appreciated that frame 300 may be a unitary frame in accordance with some embodiments. In some embodiments, the environment within frame 300 is a controlled atmosphere (or environment). As used herein, the phrase "controlled atmosphere" and "controlled environment" will be understood to be equivalent and will be understood to include one of a vacuum, or an inert gas. Examples of inert gases include helium, neon, argon, krypton, xenon, and nitrogen, as well as combinations thereof.

Still referring to FIG. 3, load lock/factory interface 302 provides access into the plurality of modules of the HPC system. Robot 314 provides for the movement of substrates (and masks) between the modules and for the movement into and out of the load lock 302. Modules (or processing tools) 304-312 may be any set of modules and preferably include one or more combinatorial modules. For example, module 304 may be a deposition module (e.g., physical vapor deposition (PVD), chemical vapor deposition (CVD), atomic layer deposition (ALD), etc.), module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system, including the power supplies and synchronization of the duty cycles described in more detail below. Further details of one possible HPC system are described in U.S. application Ser. No. 11/672,478 filed Feb. 7, 2007, now U.S. Pat. No. 7,867,904 and claiming priority to U.S. Provisional Application No. 60/832,248 filed on Jul. 19, 2006, and U.S. application Ser. No. 11/672,473, filed Feb. 7, 2007, and claiming priority to U.S. Provisional Application No. 60/832,248 filed on Jul. 19, 2006, which are all herein incorporated by reference. With HPC system, a plurality of methods may be employed to deposit material upon a substrate employing combinatorial processes.

Figure 4:
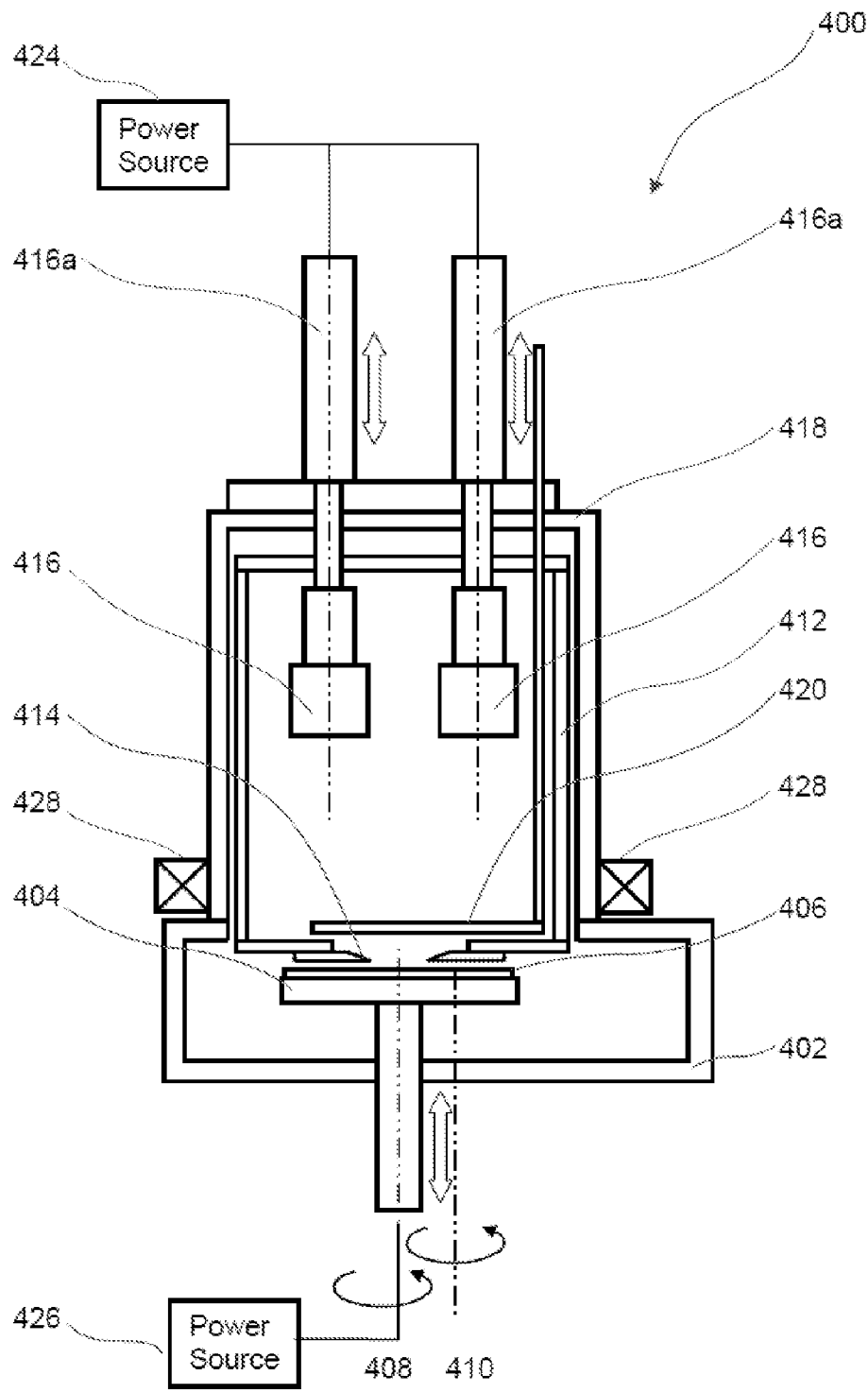
FIG. 4 is a simplified schematic diagram illustrating a sputter processing chamber configured to perform combinatorial processing and full substrate processing according to some embodiments.

FIG. 4 is a simplified schematic diagram illustrating a PVD chamber (or processing tool), more particularly, a sputter chamber, configured to perform combinatorial processing and full substrate processing in accordance with some embodiments of the invention. Processing chamber 400 includes a bottom chamber portion 402 disposed under top chamber portion 418. Within bottom portion 402, substrate support 404 is configured to hold a substrate 406 disposed thereon and can be any known substrate support, including but not limited to a vacuum chuck, electrostatic chuck or other known mechanisms. Substrate support 404 is capable of both rotating around its own central axis 408 (referred to as "rotation" axis), and rotating around an exterior axis 410 (referred to as "revolution" axis). Such dual rotary substrate support is central to combinatorial processing using site-isolated mechanisms. Other substrate supports, such as an XY table, can also be used for site-isolated deposition. In addition, substrate support 404 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source 426 provides a bias power to substrate support 404 and substrate 406 and produces a negative bias voltage on substrate 406. In some embodiments power source 426 provides a radio frequency (RF) power sufficient to take advantage of the high metal ionization to improve step coverage of vias and trenches of patterned wafers. In some embodiments, the RF power supplied by power source 426 is pulsed and synchronized with the pulsed power from power source 424.

Substrate 406 may be a conventional round 200 mm, 300 mm, or any other larger or smaller substrate/wafer size. In some embodiments, substrate 406 may be a square, rectangular, or other shaped substrate. In some embodiments, substrate 406 is made of glass, a polymer, a plastic, and/or polycarbonate. However, in other embodiments, the substrate 406 is made of a semiconductor material, such as silicon. One skilled in the art will appreciate that substrate 406 may be a blanket substrate, a coupon (e.g., partial wafer), or even a patterned substrate having predefined regions. In some embodiments, substrate 406 may have regions defined through the processing described herein. The term region is used herein to refer to a localized (or site-isolated) area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

Top chamber portion 418 of chamber 400 in FIG. 4 includes process kit shield 412, which defines a confinement region over a radial portion of substrate 406. Process kit shield 412 is a sleeve having a base (optionally integrated with the shield) and an optional top within chamber 400 that may be used to confine a plasma generated therein. The generated plasma will dislodge atoms from a target and the sputtered atoms will deposit on an exposed surface of substrate 406 to combinatorial process regions of the substrate in a site-isolated manner (e.g., such that only the particular region on the substrate is processed) in some embodiments. In other embodiments, full wafer processing can be achieved by optimizing gun tilt angle and target-to-substrate spacing, and by using multiple process guns 416. Process kit shield 412 is capable of being moved in and out of chamber 400 (i.e., the process kit shield is a replaceable insert). In other embodiments, process kit shield 412 remains in the chamber for both the full substrate and combinatorial processing. Process kit shield 412 includes an optional top portion, sidewalls and a base. In some embodiments, process kit shield 412 is configured in a cylindrical shape, however, the process kit shield may be any suitable shape and is not limited to a cylindrical shape.

The base of process kit shield 412 includes an aperture 414 through which a surface of substrate 406 is exposed for deposition or some other suitable semiconductor processing operations. Aperture shutter 420 which is moveably disposed over the base of process kit shield 412. Aperture shutter 420 may slide across a bottom surface of the base of process kit shield 412 in order to cover or expose aperture, 414, in some embodiments. In other embodiments, aperture shutter 420 is controlled through an arm extension which moves the aperture shutter to expose or cover aperture 414. It should be noted that although a single aperture is illustrated, multiple apertures may be included. Each aperture may be associated with a dedicated aperture shutter or an aperture shutter can be configured to cover more than one aperture simultaneously or separately. Alternatively, aperture 414 may be a larger opening and aperture shutter 420 may extend with that opening to either completely cover the aperture or place one or more fixed apertures within that opening for processing the defined regions. The dual rotary substrate support 404 is central to the site-isolated mechanism, and allows any location of the substrate or wafer to be placed under the aperture 414. Hence, the site-isolated deposition is possible at any location on the wafer/substrate.

In the example shown in FIG. 4, two process guns 416 are included, each of which includes a target (not shown) that includes one or more materials (e.g., any of the materials described herein, such as silicon, copper, carbon, etc.) to be deposited onto the substrate 406. Process guns 416 are moveable in a vertical direction so that one or both of the guns may be lifted from the slots of the shield. While two process guns are illustrated, any number of process guns may be included (e.g., one, three, four or more process guns). Where more than one process gun is included, the plurality of process guns may be referred to as a cluster of process guns. In some embodiments, process guns 416 are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc.

Top chamber portion 418 of chamber 400 of FIG. 4 includes sidewalls and a top plate which house process kit shield 412. Arm extensions 416a which are fixed to process guns 416 may be attached to a suitable drive, (i.e., lead screw, worm gear, etc.), configured to vertically move process guns 416 toward or away from a top plate of top chamber portion 418. Arm extensions 416a may be pivotally affixed to process guns 416 to enable the process guns to tilt relative to a vertical axis. In some embodiments, process guns 416 tilt toward aperture 414 when performing combinatorial processing and tilt toward a periphery of the substrate being processed when performing full substrate processing. It should be appreciated that process guns 416 may tilt away from aperture 414 when performing combinatorial processing in other embodiments. In yet other embodiments, arm extensions 416a are attached to a bellows that allows for the vertical movement and tilting of process guns 416. Arm extensions 416a enable movement with four degrees of freedom in some embodiments. Where process kit shield 412 is utilized, the aperture openings are configured to accommodate the tilting of the process guns. The amount of tilting of the process guns may be dependent on the process being performed in some embodiments.

Power source 424 provides power for sputter guns 416 whereas power source 426 provides RF bias power to an electrostatic chuck. As mentioned above, the output of power source 426 is synchronized with the output of power source 424. It should be appreciated that power source 424 may output a direct current (DC) power supply or a radio frequency (RF) power supply. In other embodiments, the DC power is pulsed and the duty cycle is less than 30% on-time at maximum power in order to achieve a peak power of 10-15 kilowatts. Thus, the peak power for high metal ionization and high density plasma is achieved at a relatively low average power which will not cause any target overheating/cracking issues. It should be appreciated that the duty cycle and peak power levels are exemplary and not meant to be limiting as other ranges are possible and may be dependent on the material and/or process being performed.

FIGS. 5-11 illustrate a method for forming an interconnect (or via) barrier according to some embodiments. It should be understood that in some embodiments the method described below (e.g., at least with respect to the forming of the graphene) may be performed in a combinatorial manner in accordance with the exemplary details of combinatorial processing described above.

Figure 5:
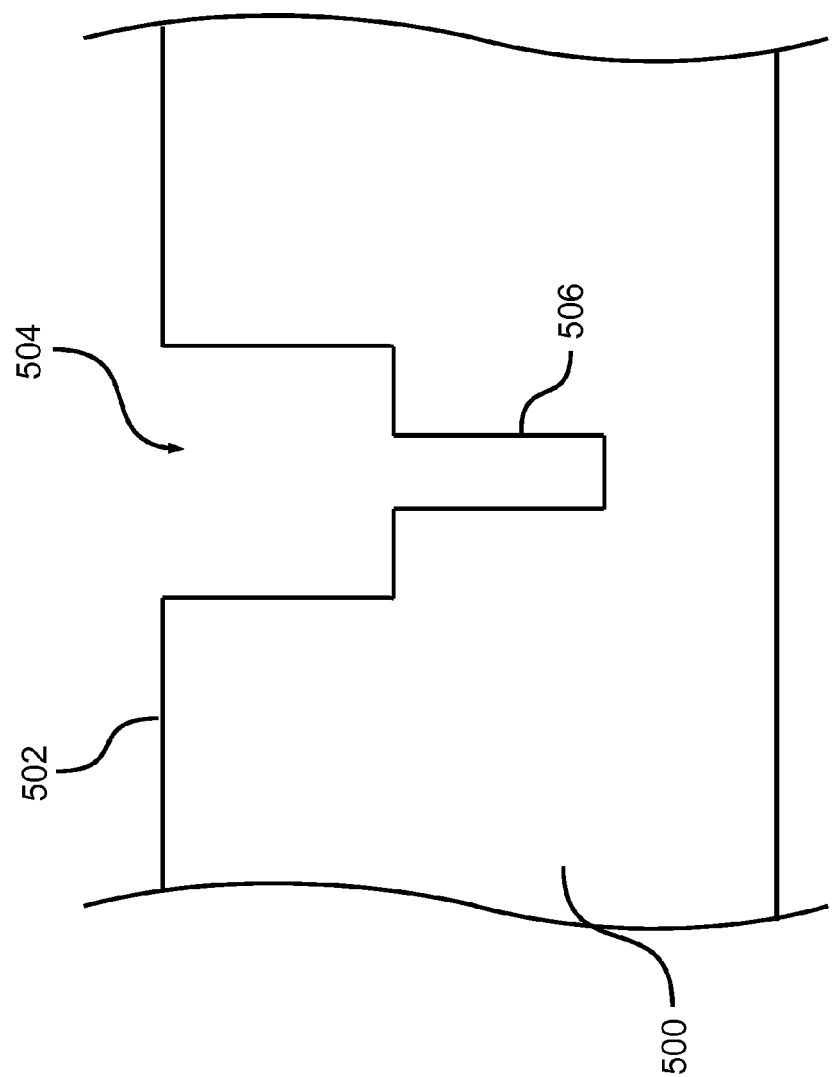
FIG. 5 is a cross-sectional view of a dielectric body according to some embodiments.

Referring now to FIG. 5, a dielectric body 500 is provided. In some embodiments, the dielectric body is made of a dielectric material, such as silicon oxide, silicon nitride, a low-k dielectric material (e.g., having a dielectric constant less than 3.9), such as porous silicon oxide, fluorine-doped silicon oxide, carbon-doped silicon oxide, etc., or a combination thereof. Although the dielectric body 500 is shown as a substrate, it should be understood that in some embodiments the dielectric body 500 is a dielectric layer such an interlayer dielectric (ILD), formed above a substrate (e.g., a semiconductor substrate) having one or more microelectronic devices (e.g., transistors) formed thereon (i.e., above the substrate, below the ILD). In some embodiments, the substrate above which the dielectric layer is formed (also) includes glass.

The dielectric body 500 has a surface (e.g., an upper surface) with a trench 504 formed therein (or thereon). In the depicted embodiment, the trench 504 has a tiered shape with a width of, for example, about 1.7 nanometers (nm) at the narrower (i.e., the lower) portion 506 thereof. The trench 504 may be formed using, for example, reactive-ion etching (RIE) or a wet etch process.

Figure 6:
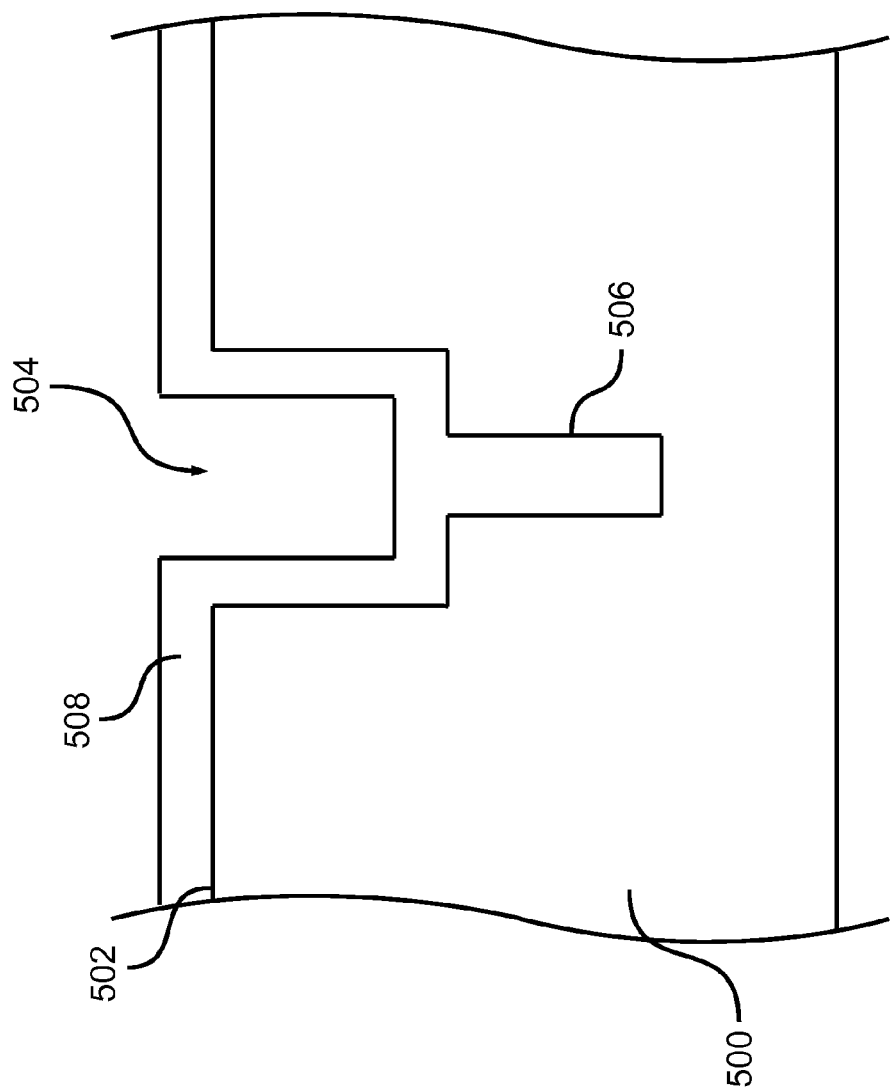
FIG. 6 is a cross-sectional view of the dielectric body of FIG. 5 with a first layer formed above.

Referring to FIG. 6, a carbon (or first) layer 508 is formed above the dielectric body 500 (i.e., above the upper surface 502 of the dielectric body 500). As shown, the carbon layer 508 is formed within the trench 504, including on the sidewalls thereof, and completely fills the lower portion 506 of the trench. In some embodiments, the carbon layer includes (or is made of) amorphous carbon, such as non-conducting (or conductive) amorphous carbon.

The carbon layer 508 may be formed using, for example, plasma-enhanced chemical vapor deposition (PECVD) or physical vapor deposition (PVD). In embodiments utilizing PECVD, the carbon source may include hydrogen and may be mixed with additional hydrogen gas to deposit the amorphous carbon. In embodiments utilizing PVD, the amorphous carbon may include small amount of oxygen and/or nitrogen, along with trace metals. Thus, the amorphous carbon may include hydrogen, oxygen, and/or nitrogen. The processing temperature of the deposition process may be, for example, between room temperature (e.g., 20-25° C.) and about 450°

C. In some embodiments, the carbon layer 508 has a thickness of, for example, between about 1.0 nm and about 10 nm.

In some embodiments, a ratio of (conducting) $sp^2$ bonds to (non-conducting) $sp^3$ bonds in the amorphous carbon is not more than about 2:1. In some embodiments, the amorphous carbon in the carbon layer includes about 50% $sp^3$ bonds and about 50% $sp^2$ bonds. In some embodiments, the amorphous carbon includes between about 30% and about 50% $sp^3$ bonds.

Figure 7:
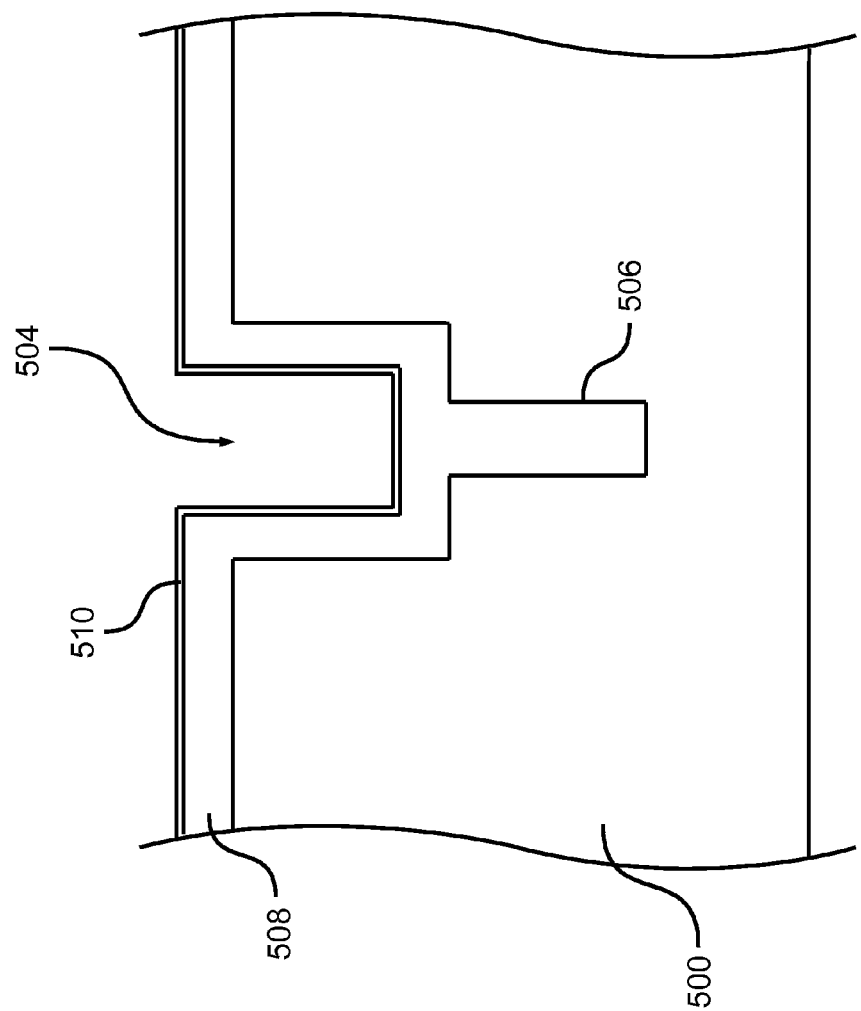
FIG. 7 is a cross-sectional view of the dielectric body of FIG. 6 with a second layer formed above the first layer.

As shown in FIG. 7, a seed (or second) layer 510 is then formed above the carbon layer 508. In some embodiments, the seed layer 510 includes (or is made of) a metal, such as copper, nickel, cobalt, titanium, or a combination thereof (e.g., alloys, such as nickel-titanium, or a multi-layer seed layer). The seed layer 510 may be deposited using, for example, PVD or CVD. In some embodiments, the seed layer 510 has a thickness of, for example, between about 0.5 nm and about 1.0 nm.

Figure 8:
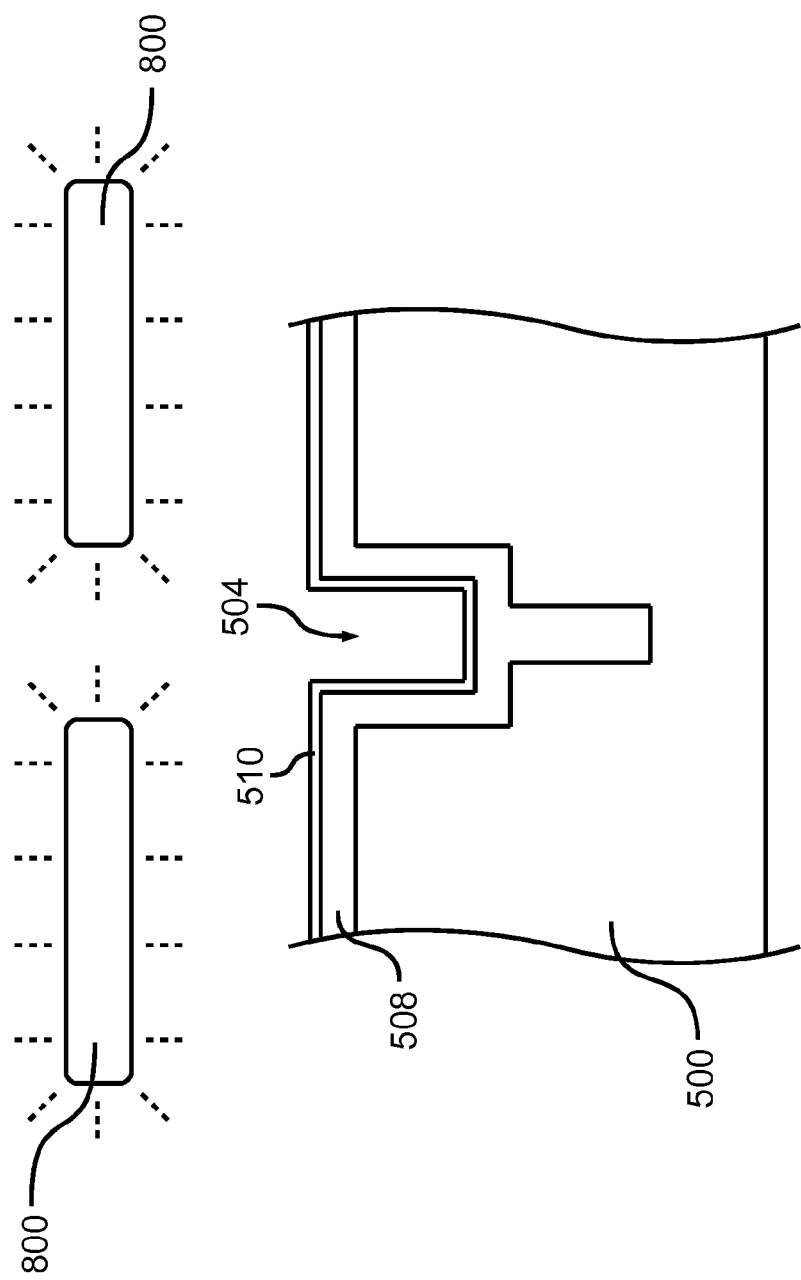
FIG. 8 is a cross-sectional view of the dielectric body of FIG. 7 undergoing a heating process.

Referring to FIG. 8, the dielectric body 500, along with the carbon layer 508 and the seed layer 510, undergo an annealing process. In some embodiments, the annealing process includes heating the dielectric body 500 to a temperature of between about 120° C. and about 1200° C. In some embodiments, the temperature is not more than about 900° C. (e.g., between about 120° C. and about 900° C.), such as between about 120° C. and about 500° C., preferably between about 120° C. and about 450° C. The annealing time may range between about 1 minute and about 60 minutes. In some embodiments, the heating includes increasing the temperature at a rate of, for example, between about 10° C. per minute and about 40° C. per minute. The heating may be performed in a controlled atmosphere oven (e.g., a vacuum oven) utilizing heating elements 800, as is commonly understood. Additionally, in some embodiments, the dielectric body 500 remains in a controlled atmosphere (i.e., without "breaking vacuum") at least between the cessation of the forming of the seed layer 510 and the annealing process (e.g., to prevent the seed layer 510 from being oxidized and/or otherwise contaminated). In some embodiments, the dielectric body may also remain in a controlled atmosphere between the beginning of the forming of the carbon layer 508 and the cessation of the forming of the seed layer 510 (e.g., to further prevent any contamination).

In some embodiments, the amorphous carbon in the carbon layer 508 is dissolved by the metal in the seed layer 510 and subsequently re-crystallized during the annealing operation. That is, the amorphous carbon is exposed to the metal, a carbide is formed with the metal where the carbide is unstable, and is transformed to graphene during the annealing process. Thus, the annealing converts (at least some of) the non-conducting $sp^3$ bonds of the amorphous carbon layer to conducting $sp^2$ hybridization bonds through a metal catalyzed mechanism. In some embodiments, the conducting graphitized carbon (i.e., the grapheme) includes only $sp^2$ bonds (i.e., all of the $sp^3$ bonds are converted to $sp^2$ bonds during the annealing process).

It should be appreciated that graphene may refer to domains of $sp^2$ bonded carbon with single or multiple graphene layers, with the size of the individual domains determined by the properties of the seed layer. The number of graphene layers depends on the thickness of the amorphous carbon film, the metal film thickness and annealing conditions in some embodiments.

Figure 9:
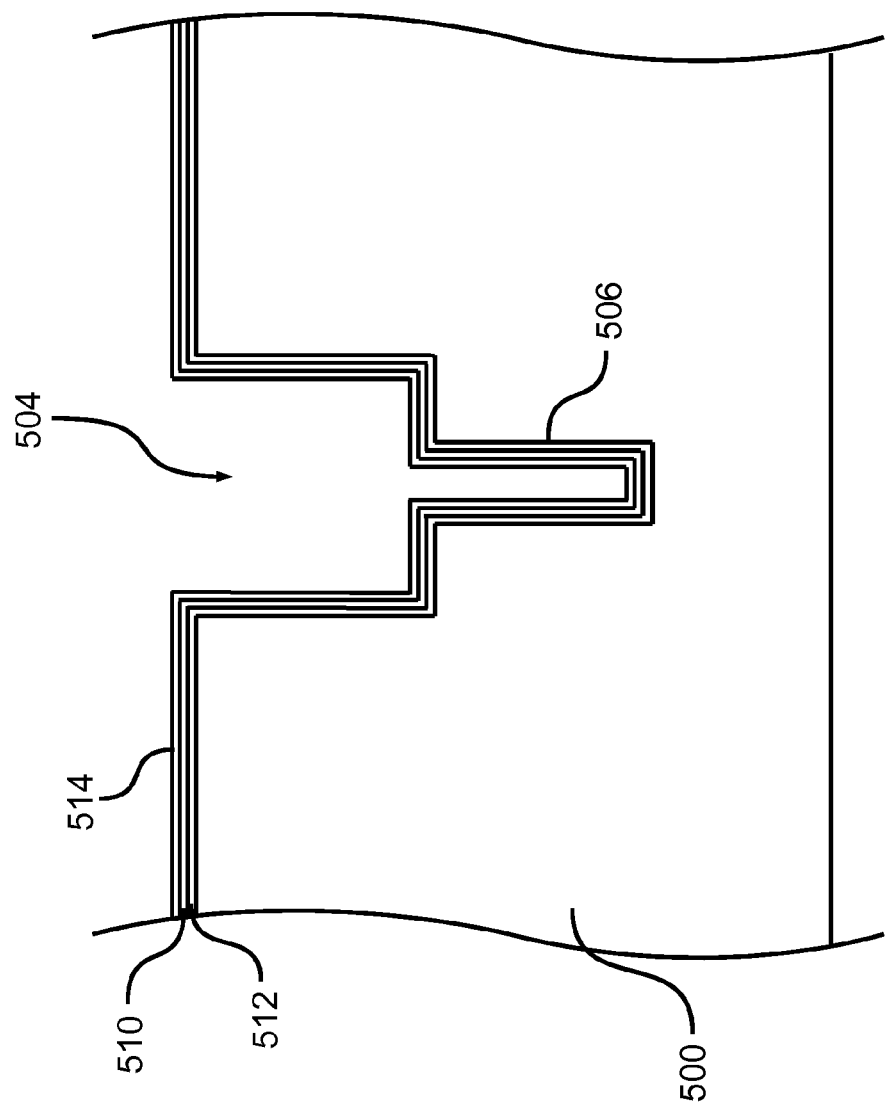
FIG. 9 is a cross-sectional view of the dielectric body of FIG. 8 after the heating process.

Thus, during the annealing process, the carbon layer 508 (or at least some of the amorphous carbon therein) is converted into at least one graphene layer. FIG. 9 illustrates the dielectric body 500 after the annealing process in some embodiments. In the depicted embodiment, the carbon layer 508 has been converted into a first graphene layer 512 and a second graphene layer 514. The first graphene layer 512 is between the dielectric body 500 and the seed layer 510, and the second graphene layer 514 is above the seed layer 510. Each of the graphene layers 512 and 514 may have a thickness of, for example, between about 0.1 nm and about 0.4 nm. In some embodiments, after the annealing process, the combined thickness of the graphene layers 512 and 514 and the seed layer 510 is small enough such that the lower portion 506 of the trench 504 (previously filled by the carbon layer 508) is at least partially opened.

It should be understood that in some embodiments only one graphene layer may be formed during the annealing process. The formation/presence of the two graphene layers may depend on, for example, the thickness of the carbon layer 508, the thickness of the seed layer 510, and the temperature at which the annealing occurs. For example, decreasing the thickness of the carbon layer 508 and/or increasing the thickness of the seed layer 510 may result in only one graphene layer being formed (e.g., the first graphene layer 512).

Figure 10:
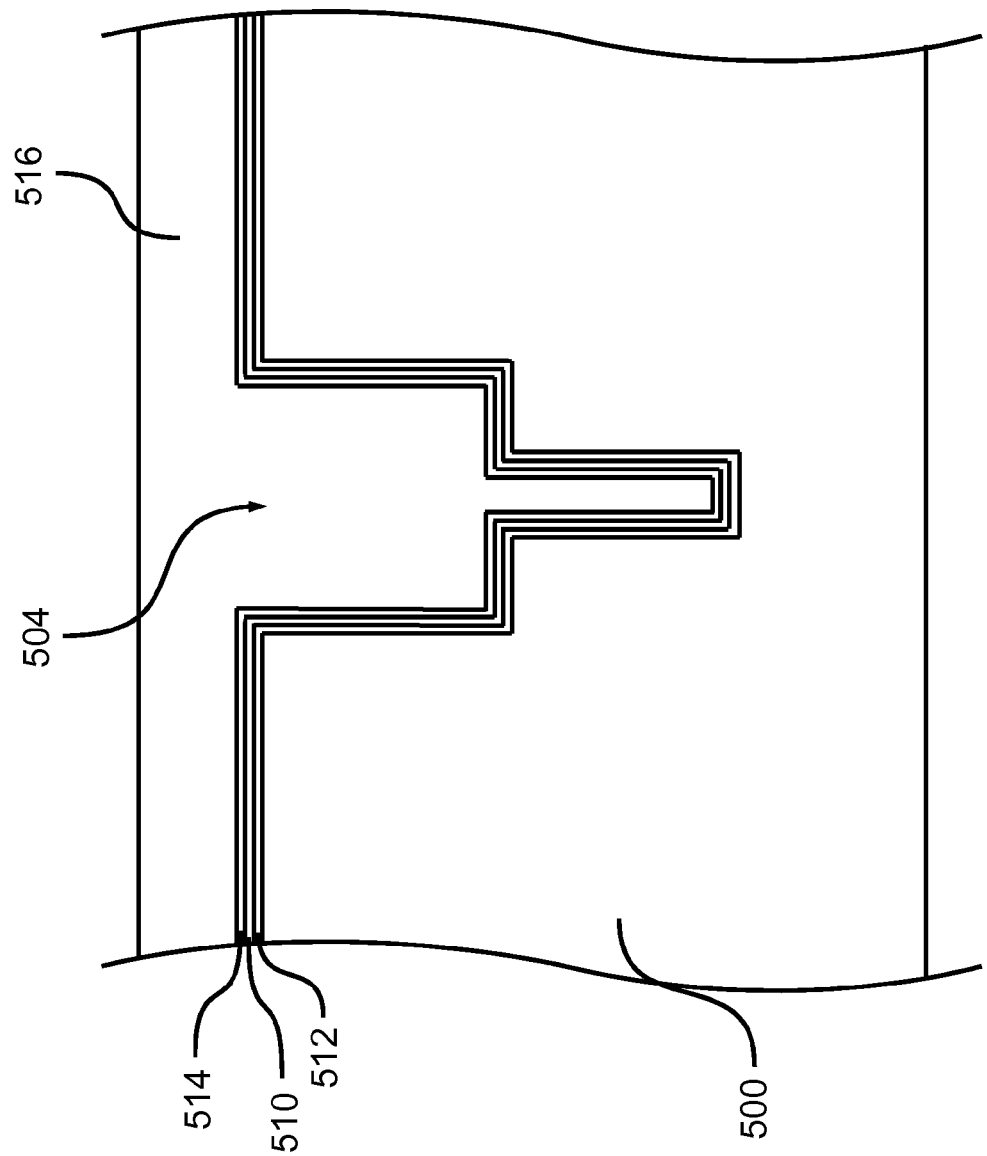
FIG. 10 is a cross-sectional view of the dielectric body of FIG. 9 with a conductive layer formed above.

Referring now to FIG. 10, a conductive layer 516 is then formed above the graphene layers 512 and 514 and the seed layer 510. As shown, the material of the conductive layer 516 completely fills the trench 504, including the lower portion 506 thereof. In some embodiments, the conductive layer 516 is made of a metal, such as copper, and is formed using, for example, PVD or an electroplating process. It should be noted that the graphene layers 512 and/or 514 and the seed layer 510 may serve as a composite seed layer for the conductive material in the conductive layer 516.

Figure 11:
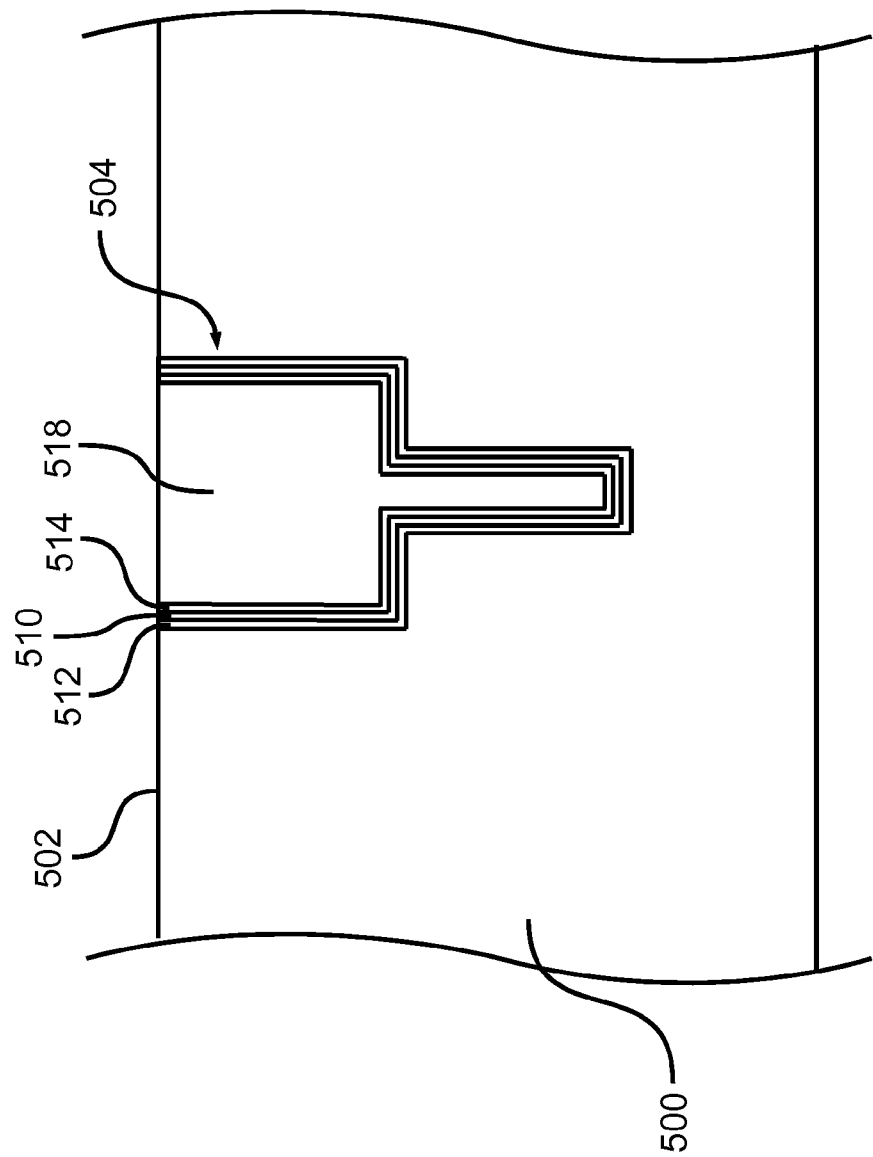
FIG. 11 is a cross-sectional view of the dielectric body of FIG. 10 after conductive layer has been planarized.

Next, as shown in FIG. 11, the conductive layer 516 is planarized down to the upper surface 502 of the dielectric body 500. In some embodiments, the planarization is performed using a chemical-mechanical planarization (CMP) process, as is commonly understood. After the planarization process, the portion of the conductive layer 516 within the trench 504 remains to form a via (or interconnect) 518, as is commonly understood. As shown, the via 518 is separated from the dielectric body 500 by the portions of the graphene layers 512 and 514 and the seed layer 510 formed on the sidewalls and the bottom of the trench 504.

The method(s) described above provide the use of graphene in interconnect barriers in such a way that is compatible with conventionally semiconductor substrate processing techniques (e.g., back end of the line (BEOL) processing), as the processing temperatures used to form the graphene (e.g., the annealing temperature) may be below about 900° C. The graphene provides a very thin and conformal barrier that suitably prevents the diffusion of the material of the interconnect (e.g., copper) into the dielectric material. Furthermore, in embodiments in which some of the graphene is present in a layer above the seed layer after the annealing process, the graphene-encapsulated metal (e.g., copper) may be useful as a conductor for high current densities.

Figure 12:
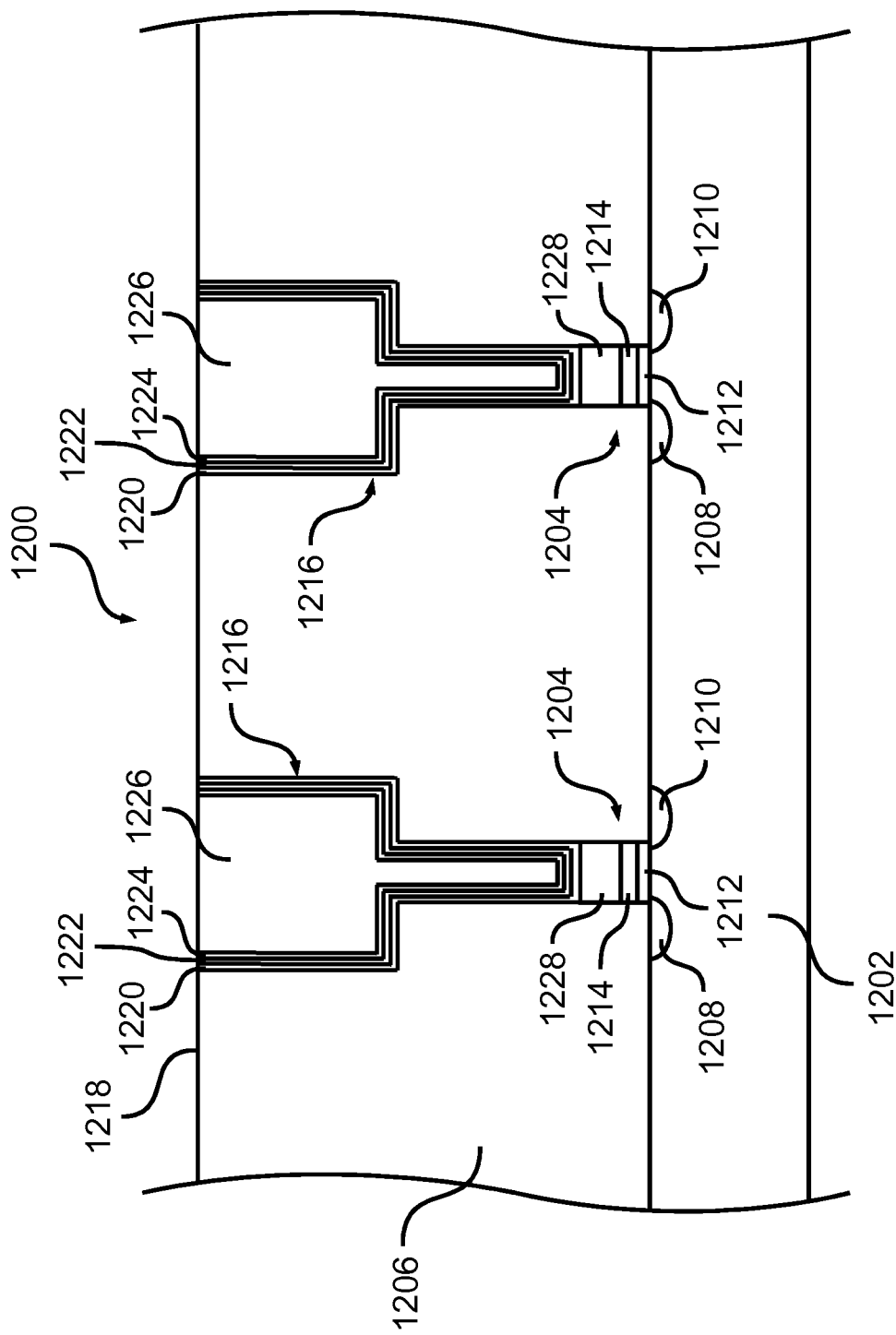
FIG. 12 is a cross-sectional view of a microelectronic assembly according to some embodiments.

FIG. 12 is a simplified (or schematic) cross-sectional view of a microelectronic assembly 1200 according to some embodiments. The microelectronic assembly 1200 includes a substrate 1202 with microelectronic devices 1204 formed thereon and a dielectric layer (e.g., ILD) 1206 formed above the microelectronic devices 1204.

It should be understood that in some embodiments the microelectronic assembly (e.g., at least with respect to the forming of the graphene) may be formed in a combinatorial manner in accordance with the exemplary details of combinatorial processing described above. It should also be understood that the various components on the substrate may be formed using processing techniques suitable for the particular materials being deposited, such as PVD (e.g., co-sputtering in some embodiments), CVD, electroplating, etc. Furthermore, it should be understood that the various components may be sized and shaped using a photolithography process and an etching process, as is commonly understood.

In some embodiments, the substrate 1202 includes (or is made of) a semiconductor material (e.g., silicon, germanium, etc.) and/or glass. In the example shown in FIG. 12, the microelectronic devices 1204 are transistors (e.g., metal-oxide-semiconductor field-effect transistors (MOSFETs), each of which includes a source region (or electrode) 1208, a drain region 1210, a gate dielectric layer 1212, and a gate electrode 1214.

The dielectric layer 1206 has trenches (or via trenches) 1216 formed in an upper surface 1218 thereof. In the example shown, the trenches 1216 are each vertically aligned with the gate electrode 1214 of one of the microelectronic devices 1204. Within each of the trenches 1216 a first graphene layer 1220, a seed barrier layer 1222, and a second graphene layer 1224, similar to those described above, are formed, along with a via (or interconnect) 1226. The via 1226 may be made of copper and be formed in a manner similar to the via 518 described above.

The via 1226, as well as the layers 1220, 1222, and 1224, formed in each trench 1216 may be electrically connected (or coupled) to, for example, the gate electrode 1214 of the respective microelectronic device 1204 through a plug 1228 (e.g., tungsten, aluminum, etc.). Although the vias 1226 (and layers 1220, 1222, and 1224) are shown as being directly connected to the microelectronic devices 1204, it should be understood that in some embodiments, additional dielectric layers and corresponding trenches, vias, etc. are formed between the dielectric layer 1206 and the substrate 1201.

Figure 13:
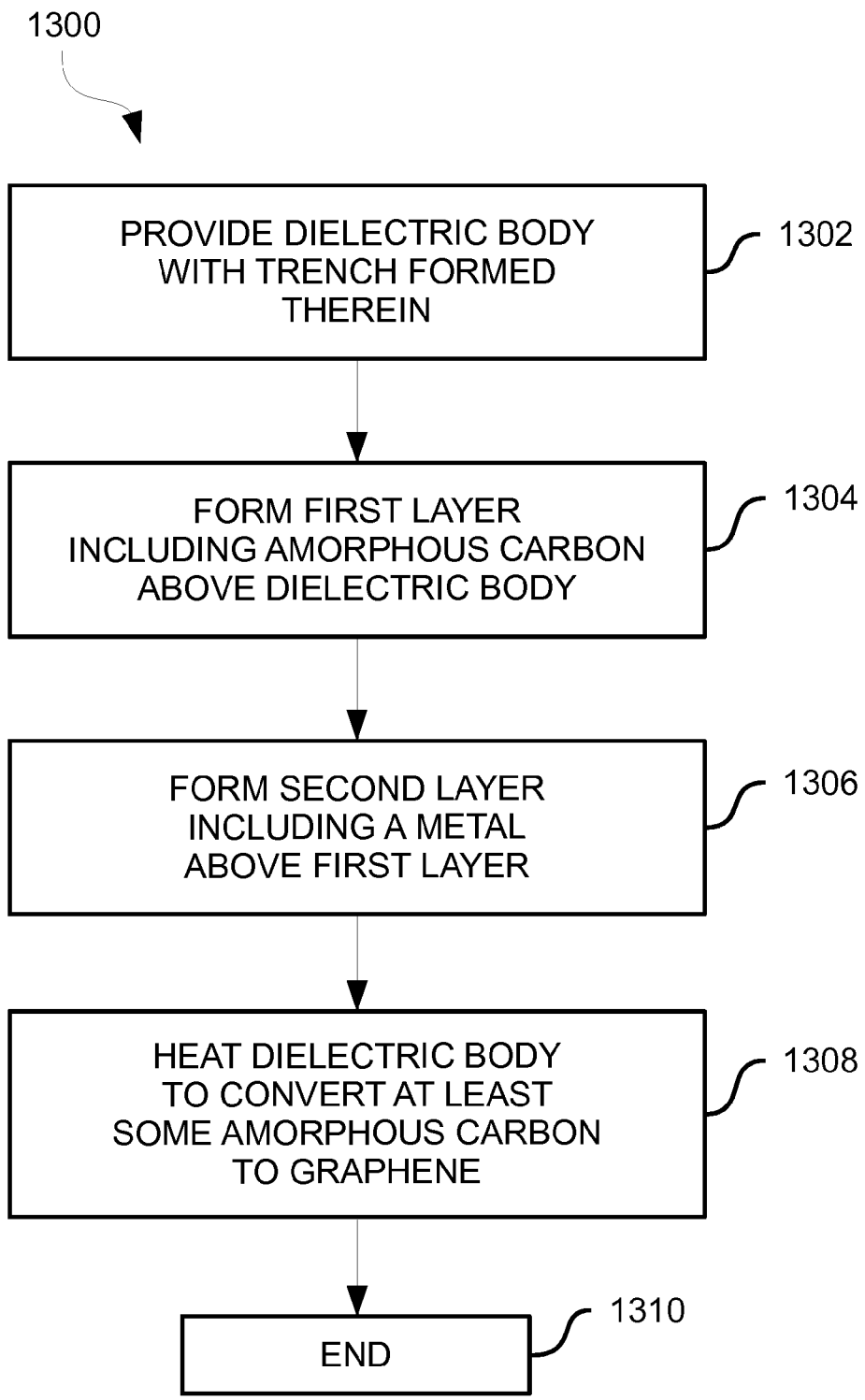
FIG. 13 is a flow chart illustrating a method for forming an interconnect barrier according to some embodiments.

FIG. 13 is a flow chart illustrating a method 1300 for forming an interconnect barrier according to some embodiments. At block 1302, the method 1300 begins with a dielectric body being provided. The dielectric body has a trench formed in a surface thereof. In some embodiments, the dielectric body includes a dielectric material, such as silicon oxide, silicon nitride, a low-k dielectric material (e.g., having a dielectric constant less than 3.9), such as porous silicon oxide, fluorine-doped silicon oxide, carbon-doped silicon oxide, etc., or a combination thereof. The dielectric body may be a dielectric layer, such an interlayer dielectric (ILD), formed above a substrate (e.g., a semiconductor substrate) having microelectronic devices (e.g., transistors) formed thereon.

At block 1304, a first layer is formed above the dielectric body (and within the trench). In some embodiments, the first layer includes amorphous carbon. The amorphous carbon may include hydrogen. In some embodiments, a ratio of (conducting) $sp^2$ bonds to (non-conducting) $sp^3$ bonds in the amorphous carbon is not more than about 2:1. In some embodiments, the amorphous carbon in the carbon layer includes about 50% $sp^3$ bonds and about 50% $sp^2$ bonds.

At block 1306, a second layer is formed above the first layer. In some embodiments, the second layer includes a metal, such as copper, nickel, cobalt, titanium, gold, or a combination thereof (e.g., alloys, such as nickel-titanium).

At block 1308, the dielectric body (and/or the first and second layers) are heated (e.g., during an annealing process). In some embodiments, the dielectric body is heated to a temperature of between about 120° C. and about 1200° C. In some embodiments, the temperature is not more than about 900° C., such as between about 120° C. and about 500° C., preferably between about 120° C. and about 450° C. The heating process may occur for between about 1 minute and about 60 minutes.

As described above, the heating process may convert at least some of the amorphous carbon into graphene, which may reside in one of more layers below and/or above the second layer (after the heating process). Although not shown, the method 1300 may also include forming a conductive body (e.g., a via or interconnect) above the grapheme layer(s) and the second layer, within the trench. Additionally, in some embodiments, the method further includes forming other components of a microelectronic assembly, such as those shown in FIG. 12. At block 1310, the method ends.

Thus, in some embodiments, methods are provided. A dielectric body having a trench formed in a surface thereof is provided. A first layer is formed above the dielectric body within the trench. The first layer includes amorphous carbon. A second layer is formed above the first layer. The second layer includes a metal. The dielectric body, the first layer, and the second layer are heated to convert at least some of the amorphous carbon to graphene.

In some embodiments, methods for forming a microelectronic assembly are provided. A substrate is provided. The substrate has a microelectronic device formed above and a dielectric layer formed above the microelectronic device. The dielectric layer has a trench formed in a surface thereof. A first layer is formed above the dielectric layer within the trench. The first layer includes amorphous carbon. A second layer is formed above the first layer. The second layer includes a metal. The dielectric layer, the first layer, and the second layer are heated to a temperature of between about 120° C. and about 900° C. to convert at least some of the amorphous carbon to graphene. A conductive body is formed within the trench. The conductive body is electrically connected to the microelectronic device.

In some embodiments, methods for forming a microelectronic assembly are provided. A substrate is provided. The substrate has a transistor formed above and a dielectric layer formed above the transistor. The dielectric layer has a trench formed in a surface thereof. A first layer is formed above the dielectric layer within the trench. The first layer includes amorphous carbon. A second layer is formed above the first layer. The second layer includes copper, nickel, cobalt, titanium, or a combination thereof. The dielectric layer, the first layer, and the second layer are heated to a temperature of between about 120° C. and about 450° C. to convert at least some of the amorphous carbon to graphene. A conductive body is formed within the trench. The conductive body is electrically connected to the transistor.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method comprising:
   providing a dielectric body having a trench formed in a surface thereof;
   forming a first layer above the dielectric body within the trench, wherein the first layer comprises amorphous carbon and completely fills at least a portion of the trench;
   forming a second layer above the first layer, wherein the second layer comprises a metal, and all of the second layer is positioned external to the at least a portion of the trench; and
   heating the dielectric body, the first layer, and the second layer to convert at least some of the amorphous carbon to graphene, wherein at least some of the graphene is positioned within the at least a portion of the trench,
wherein the at least a portion of the trench comprises is a second portion having a second width, the trench further comprising a first portion having a first width, wherein the second width is less than the first width, the first portion of the trench is positioned between the second portion of the trench and the surface of the dielectric body, the first layer completely fills the second portion of the trench before the heating of the dielectric body, the first layer, and the second layer, and after the heating of the dielectric body, the first layer, and the second layer, the second portion of the trench is at least partially opened.

2. The method of claim 1, wherein a ratio of $sp^2$ bonds to $sp^3$ bonds in the amorphous carbon is not more than about 2:1.

3. The method of claim 2, wherein the first layer further comprises hydrogen.

4. The method of claim 1, wherein the heating is performed at a temperature of between about 120° C. and about 450° C.

5. The method of claim 4, wherein the second layer comprises at least one of copper, titanium, gold, or a combination thereof.

6. The method of claim 1, wherein the dielectric body is a dielectric layer formed above a substrate.

7. The method of claim 6, wherein the substrate further comprises a microelectronic device, wherein the dielectric layer is formed above the microelectronic device.

8. The method of claim 7, further comprising forming a conductive body in the trench, wherein the conductive body is electrically connected to the microelectronic device.

9. The method of claim 1, wherein the graphene forms a graphene layer, and the graphene layer conforms to the shape of the second portion of the trench.

10. A method for forming a microelectronic assembly, the method comprising:
    providing a substrate having a microelectronic device, the substrate further comprising a dielectric layer formed above the microelectronic device, wherein the dielectric layer has a trench formed in a surface thereof, wherein the trench comprises an upper portion having a first width and a lower portion having a second width, wherein the second width is less than the first width;
    forming a first layer above the dielectric layer within the trench, wherein the first layer comprises amorphous carbon and completely fills the lower portion of the trench;
    forming a second layer above the first layer, wherein the second layer comprises a metal, and all of the second layer is positioned external to the lower portion of the trench;
    heating the dielectric layer, the first layer, and the second layer to a temperature of between about 120° C. and about 900° C. to convert at least some of the amorphous carbon to graphene, wherein at least some of the graphene is positioned within the lower portion of the trench, and after the heating of the dielectric body, the first layer, and the second layer, the lower portion of the trench is at least partially opened; and
    forming a conductive body within the trench, wherein the conductive body is electrically connected to the microelectronic device, and a portion of the conductive body is positioned within the lower portion of the trench.

11. The method of claim 10, wherein the dielectric layer, the first layer, and the second layer are heated to a temperature of between about 120° C. and about 450° C.

12. The method of claim 11, wherein the second layer comprises at least one of copper, titanium, gold, or a combination thereof.

13. The method of claim 12, wherein a ratio of $sp^2$ bonds to $sp^3$ bonds in the amorphous carbon is not more than about 2:1.

14. The method of claim 13, wherein the graphene forms a graphene layer, and the graphene layer conforms to the shape of the second portion of the trench.

15. A method for forming a microelectronic assembly, the method comprising:
    providing a substrate having a transistor, the substrate further comprising a dielectric layer formed above the transistor, wherein the dielectric layer has a trench formed in a surface thereof, wherein the trench comprises an upper portion having a first width and a lower portion having a second width, wherein the second width is less than the first width;
    forming a first layer above the dielectric layer within the trench, wherein the first layer comprises amorphous carbon and completely fills the lower portion of the trench;
    forming a second layer above the first layer, wherein the second layer comprises copper, nickel, cobalt, titanium, or a combination thereof, and all of the second layer is positioned external to the lower portion of the trench;
    heating the dielectric layer, the first layer, and the second layer to a temperature of between about 120° C. and about 450° C. to convert at least some of the amorphous carbon to graphene, wherein at least some of the graphene is positioned within the lower portion of the trench, and after the heating of the dielectric body, the first layer, and the second layer, the lower portion of the trench is at least partially opened; and
    forming a conductive body within the trench, wherein the conductive body is electrically connected to the transistor, and a portion of the conductive body is positioned within the lower portion of the trench.

16. The method of claim 15, wherein a ratio of $sp^2$ bonds to $sp^3$ bonds in the amorphous carbon is not more than about 2:1.

17. The method of claim 16, wherein the first layer further comprises hydrogen.

18. The method of claim 17, wherein the substrate comprises a semiconductor material, glass, or a combination thereof.

19. The method of claim 18, wherein the dielectric layer comprises silicon oxide, silicon nitride, a low-k dielectric material, of a combination thereof, and wherein the second width is about 1.7 nanometers (nm).

* * * * *